(12) United States Patent
Mikami et al.

(10) Patent No.: US 9,524,905 B1
(45) Date of Patent: Dec. 20, 2016

(54) NITRIDED TUNGSTEN VIA

(71) Applicant: SanDisk Technologies Inc., Plano, TX (US)

(72) Inventors: Ryusuke Mikami, Yokkaichi (JP); Yasushi Matsumoto, Yokkaichi (JP); Yosuke Nakashima, Yokkaichi (JP)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/841,003

(22) Filed: Aug. 31, 2015

(51) Int. Cl.
| | | |
|---|---|---|
| *H01L 21/44* | (2006.01) | |
| *H01L 21/768* | (2006.01) | |
| *H01L 27/115* | (2006.01) | |
| *H01L 23/522* | (2006.01) | |
| *H01L 23/532* | (2006.01) | |

(52) U.S. Cl.
CPC ... *H01L 21/76849* (2013.01); *H01L 21/76846* (2013.01); *H01L 23/5226* (2013.01); *H01L 23/53266* (2013.01); *H01L 27/115* (2013.01)

(58) Field of Classification Search
CPC .................... H01L 21/76849; H01L 21/76846; H01L 23/53266; H01L 23/5226; H01L 27/115

See application file for complete search history.

(56) References Cited

U.S. PATENT DOCUMENTS

| | | | |
|---|---|---|---|
| 6,274,484 B1 * | 8/2001 | Tsai .................. | H01L 21/28079 257/E21.202 |
| 6,309,964 B1 * | 10/2001 | Tsai .................. | H01L 21/76849 257/E21.584 |
| 6,946,401 B2 | 9/2005 | Huang et al. | |
| 8,183,136 B2 | 5/2012 | Jeong et al. | |
| 8,481,433 B2 | 7/2013 | Bevan et al. | |
| 2001/0006847 A1 * | 7/2001 | Wang ................ | H01L 21/76802 438/640 |

* cited by examiner

*Primary Examiner* — A. Sefer
(74) *Attorney, Agent, or Firm* — Davis Wright Tremaine LLP (57) ABSTRACT

A nitridation step applied to a tungsten via in a first silicon oxide layer forms a tungsten nitride layer on an exposed top surface of the tungsten via. Subsequently, a second silicon oxide layer is formed over the first silicon oxide layer and the tungsten via. Subsequently, an opening is formed through the second silicon oxide layer to expose at least part of the silicon nitride layer. Subsequently, a wet clean step is performed.

9 Claims, 6 Drawing Sheets

FIG._2B (PRIOR ART)
(Section A-A)

FIG. 2C (Prior Art)
(Section B-B)

NITRIDED TUNGSTEN VIA

BACKGROUND

This application relates generally to non-volatile semiconductor memories of the flash memory type, their formation, structure and use.

Figure 1:
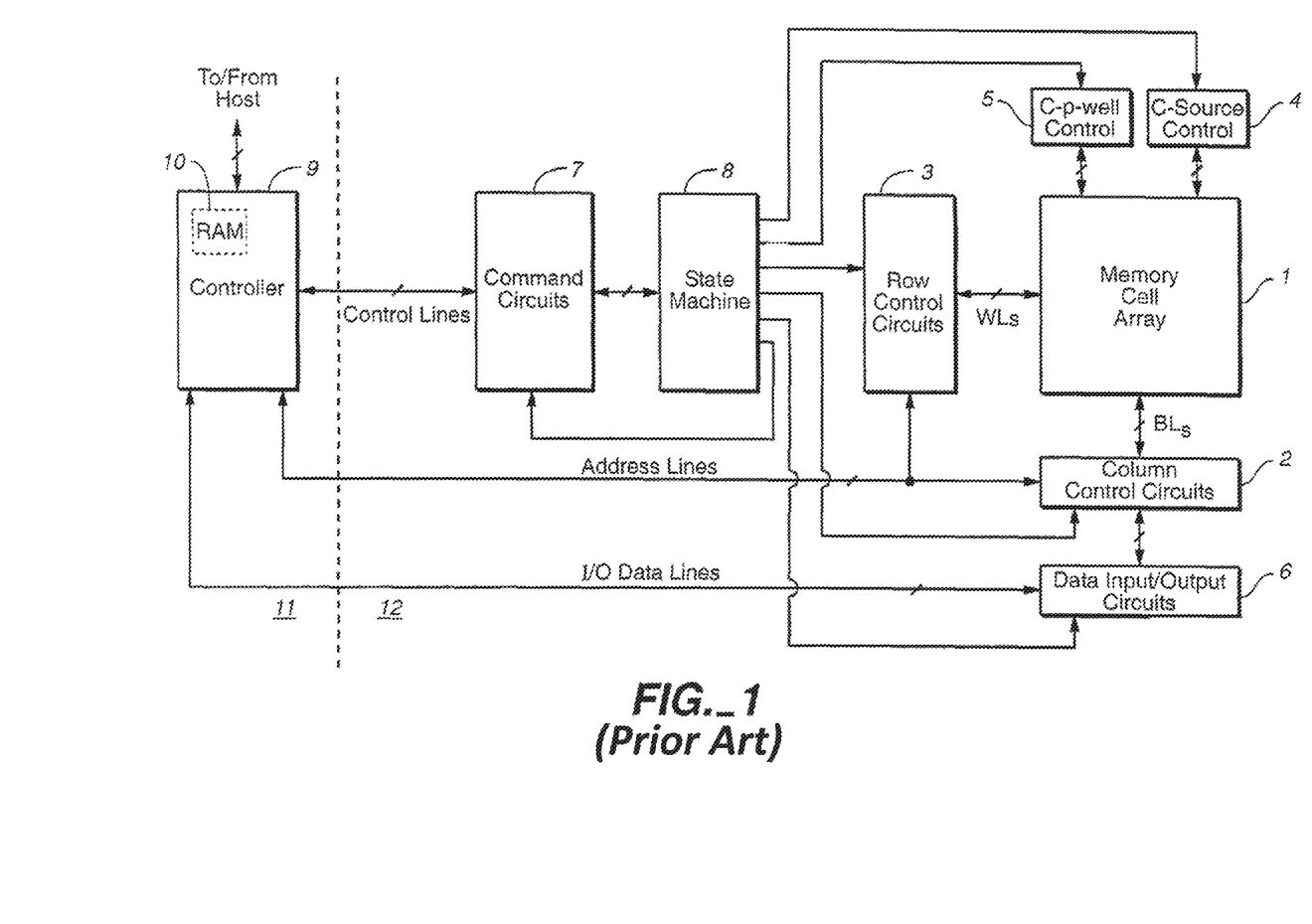
FIG. 1 is a block diagram of a prior art memory system.

There are many commercially successful non-volatile memory products being used today, particularly in the form of small form factor cards, USB drives, embedded memory, and Solid State Drives (SSDs) which use an array of flash EEPROM cells. An example of a flash memory system is shown in FIG. 1, in which a memory cell array 1 is formed on a memory chip 12, along with various peripheral circuits such as column control circuits 2, row control circuits 3, data input/output circuits 6, etc.

One popular flash EEPROM architecture utilizes a NAND array, wherein a large number of strings of memory cells are connected through one or more select transistors between individual bit lines and a reference potential. A portion of such an array is shown in plan view in FIG. 2A. Although four floating gate memory cells are shown in each string, the individual strings typically include 16, 32 or more memory cell charge storage elements, such as floating gates, in a column. Control gate (word) lines labeled WL0-WL3 and string selection lines, Drain Select Line, "DSL" and Source Select Line "SSL" extend across multiple strings over rows of floating gates. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel.

The top and bottom of the string connect to the bit line and a common source line respectively through select transistors (source select transistor and drain select transistor). Select transistors do not contain floating gates and are used to connect NAND strings to control circuits when they are to be accessed, and to isolate them when they are not being accessed.

Figure 2A:
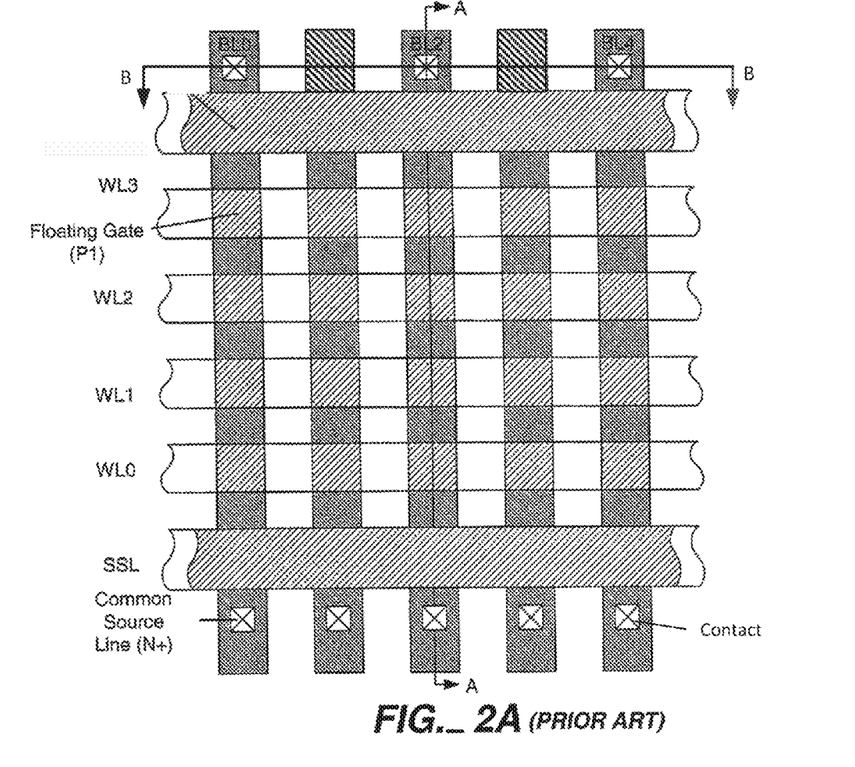
FIG. 2A is a plan view of a prior art NAND array.

NAND strings are generally connected by conductive lines in order to form arrays that may contain many NAND strings. At either end of a NAND string a contact area may be formed. This allows connection of the NAND string as part of the array. Metal contact plugs (or "vias") may be formed over contact areas to connect the contact areas (and thereby connect NAND strings) to conductive metal lines that extend over the memory array (e.g. bit lines). FIG. 2A shows bit line contacts BL0-BL4 and common source line contacts at either end of NAND strings. Contacts to contact areas may be formed by etching contact holes through a dielectric layer and then filling the holes with metal (e.g. tungsten) to form vias (contact plugs). Metal lines, such as bit lines, extend over the memory array and in peripheral areas in order to connect the memory array and various peripheral circuits. Electrical contact between metal lines (e.g. bit lines formed of copper or other suitable metal) and vias occurs where horizontal metal lines intersect vertical vias. The characteristics of such lines and vias (e.g. resistance and coupling) and the quality of connections between lines and vias may be significant factors for good memory operation.

Thus, there is a need for an integrated circuit manufacturing process that forms vias and horizontal metal lines in a reliable manner.

SUMMARY

In some integrated circuits, vias (contact plugs) extend through dielectric layers and form contacts with metal lines that are formed in overlying trenches. For example, in NAND flash memories, tungsten vias may extend through a lower silicon oxide and connect with copper bit lines formed in trenches in an overlying silicon oxide layer. After formation of vias in silicon oxide, a nitridation step may form tungsten nitride on an exposed top surface of a via and may form silicon oxynitride on exposed surfaces of the silicon oxide layer. Subsequently, when trenches are etched, interfaces between tungsten nitride and silicon oxide, and between tungsten and silicon oxynitride, provide good adhesion and low chemical penetration (e.g. during etching or cleaning).

An example of a method of forming an integrated circuit includes: forming a tungsten via in a first silicon oxide layer; performing a nitridation step that forms a tungsten nitride layer on an exposed top surface of the tungsten via; subsequently, forming a second silicon oxide layer over the first silicon oxide layer and the tungsten via; subsequently, forming an opening through the second silicon oxide layer to expose at least part of the silicon nitride layer; and subsequently, performing a wet clean step.

A metal may subsequently be deposited in the opening to electrically contact the tungsten via. The nitridation step may form a silicon oxynitride layer on the first silicon oxide layer. The opening through the second oxide layer may extend into the silicon oxynitride layer a depth that is less than the thickness of the silicon oxynitride layer. The first silicon oxide layer may be isolated from the wet clean by a remaining thickness of the silicon oxynitride layer under the opening. No direct interface between the first silicon oxide layer and the tungsten via may be exposed during the wet clean step. Performing the nitridation step may include supplying ammonia (NH3) to a process chamber. Performing the nitridation step may include generating a Radio Frequency (RF) plasma in the process chamber. Performing the nitridation step may include supplying nitrogen (N2) to a process chamber. The integrated circuit may be a NAND flash memory.

An example of a method of forming a NAND flash memory includes: forming a tungsten via in a first silicon oxide layer; performing a plasma nitridation step to form a tungsten nitride layer on an exposed top surface of the tungsten via and to form a silicon oxynitride layer on a top surface of the first silicon oxide layer; subsequently, forming a second silicon oxide layer on the silicon oxynitride layer and on the tungsten nitride layer; subsequently, forming an opening through the second silicon oxide layer to expose at least part of the tungsten nitride layer; subsequently, performing a wet clean step while the first silicon oxide layer remains covered by the silicon oxynitride layer; and subsequently, filling the opening with metal.

The opening may be a trench that extends completely through the second silicon oxide layer and further extends partially through the silicon oxynitride layer to leave a remaining thickness of the silicon oxynitride layer between the trench and the first silicon oxide layer. The metal may be copper. Performing the plasma nitridation step may include using ammonia (NH3) as a source of nitrogen. The wet clean step may use a solution that includes hydrofluoric acid (HF) to remove material including amorphous silicon.

An example of an integrated circuit includes: a first silicon oxide layer extending over a semiconductor substrate; a tungsten via extending through the first silicon oxide layer; a layer of tungsten nitride covering a top surface of the tungsten via; a second silicon oxide layer extending over the first silicon oxide layer; and a metal portion extending through the second silicon oxide layer, the metal portion having a lower surface lying in contact with the tungsten nitride layer.

A silicon oxynitride layer may extend between the first silicon oxide layer and the second silicon oxide layer. The metal portion may extend down to a level that is higher than a bottom surface of the silicon oxynitride layer so that a portion of the silicon oxynitride layer separates the metal portion from the first silicon oxide layer. The silicon oxynitride layer thickness may be between ten and thirty nanometers and the portion of the silicon oxynitride layer that separates the metal plug from the first silicon oxide layer may have a thickness that is approximately half the silicon oxynitride layer thickness. The layer of tungsten nitride may have a thickness that is between one nanometer (1 nm) and five nanometers (5 nm).

Various aspects, advantages, features and embodiments are included in the following description of examples, which description should be taken in conjunction with the accompanying drawings.

DETAILED DESCRIPTION OF EXEMPLARY EMBODIMENTS

Memory System

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

In other embodiments, types of memory other than the two dimensional and three dimensional exemplary structures described here may be used.

An example of a prior art memory system, which may be modified to include various structures described here, is illustrated by the block diagram of FIG. 1. A planar memory cell array 1 including a plurality of memory cells is controlled by a column control circuit 2, a row control circuit 3, a c-source control circuit 4 and a c-p-well control circuit 5. The memory cell array 1 is, in this example, of the NAND type similar to that described above in the Background. A control circuit 2 is connected to bit lines (BL) of the memory cell array 1 for reading data stored in the memory cells, for determining a state of the memory cells during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells are formed. The c-source control circuit 4 controls a common source line (labeled as "c-source" in FIG. 1) connected to the memory cells (M). The c-p-well control circuit 5 controls the c-p-well voltage.

The data stored in the memory cells are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

The memory system of FIG. 1 may be embedded as part of the host system, or may be included in a memory card, USB drive, or similar unit that is removably insertible into a mating socket of a host system. Such a card may include the entire memory system, or the controller and memory array, with associated peripheral circuits, may be provided in separate cards. The memory system of FIG. 1 may also be used in a Solid State Drive (SSD) or similar unit that provides mass data storage in a tablet, laptop computer, or similar device. Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use nonvolatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

Figure 2B:
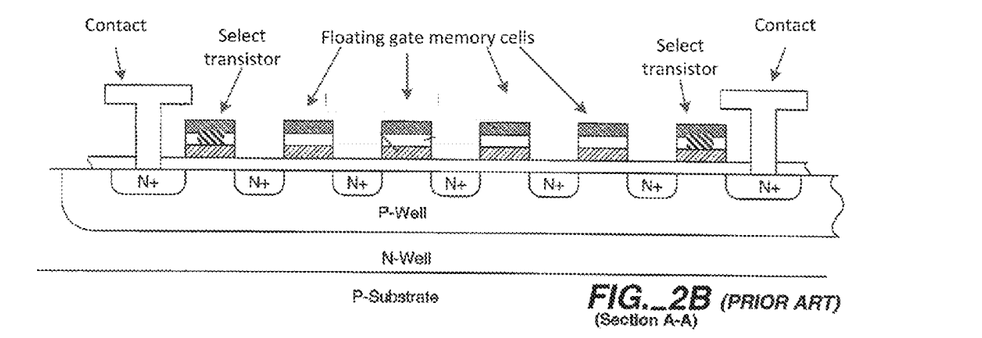
FIG. 2B shows a cross section of the NAND array of FIG. 2A.
Figure 2C:
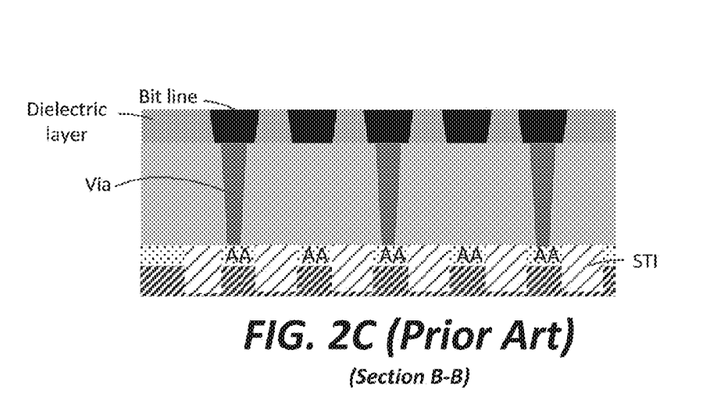
FIG. 2C shows another cross section of the NAND array of FIG. 2A.

FIGS. 2A-2C show different views of a prior art NAND flash memory. In particular, FIG. 2A shows a plan view of a portion of such a memory array including bit lines and word lines (this is a simplified structure with a small number of word lines and bit lines). FIG. 2B shows a cross section along A-A (along a NAND string) showing individual memory cells that are connected in series. Contact plugs, or vias (the two terms are used interchangeably in the present application) are formed at either end to connect the NAND strings in the memory array to conductive lines (e.g. connecting to bit lines at one end and to a common source line at the other end). Such a via may be formed of metal that is deposited into a contact hole that is formed in a dielectric layer. FIG. 2C shows a cross section along B-B of FIG. 2A. This view shows metal contact plugs extending down through contact holes in a dielectric layer (e.g. silicon oxide)

to make contact with active areas ("AA") in the substrate (i.e. with N+ areas of FIG. 2B). STI regions are located between active areas of different strings to electrically isolate an individual NAND string from its neighbors. Bit lines extend over the memory array in a direction perpendicular to the plane of the cross section shown. Alternating bit lines are connected to vias in the cross section shown. (It will be understood that other vias, that are not visible in the cross section shown, connect the remaining bit lines to other active areas). In this arrangement, locations of vias alternate so that there is more space between vias and thus less risk of contact between vias. Other arrangements are also possible. Bit lines may be formed of a metal that is a good electrical conductor such as copper (Cu), with a barrier layer, or layers, as appropriate (e.g. titanium/titanium nitride).

Figure 3:
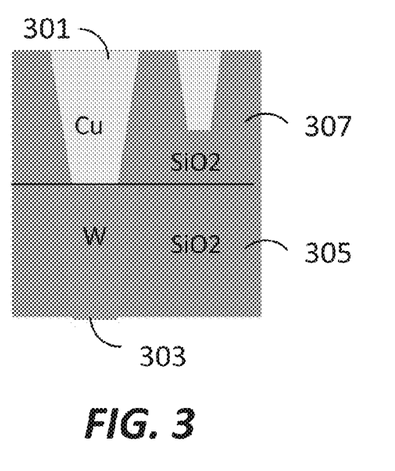
FIG. 3 illustrates an example of a bit line connected to a via.

FIG. 3 show a cross section of an example of a metal (M1) bit line 301 formed of copper connected to a via 303 (V1) formed of tungsten (W). Via 303 is formed in a first silicon oxide (e.g. $SiO_2$) layer 305 that is deposited in a Chemical Vapor Deposition (CVD) process using Tetra Ethyl Ortho Silicate (TEOS) as a source of silicon in a plasma deposition process. The bit line is formed in a second silicon oxide layer 307 that is similar to the first silicon oxide layer (i.e. also formed by CVD using TEOS).

The structure of FIG. 3 may fail in various ways. A potential failure mechanism results from penetration of wet etch chemicals such as hydrofluoric acid (HF) between tungsten and silicon oxide after formation of bit line trenches. Various chemicals may be used during etching and after etching (e.g. to remove hard mask material or etch residue after trench etching) and such chemicals (gasses or liquids) may have undesirable effects.

Figure 4:
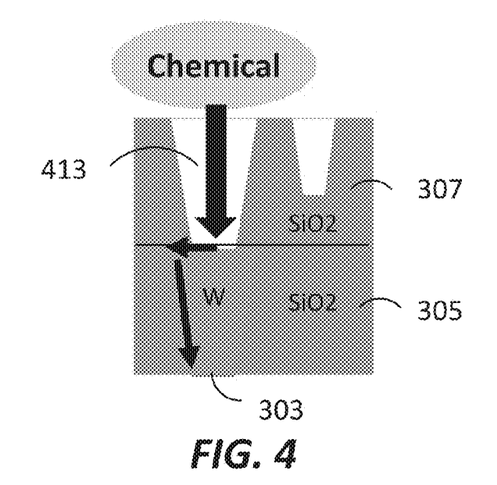
FIG. 4 illustrates an example of chemical penetration in the structure of FIG. 3.

FIG. 4 shows the structure of FIG. 3 at an intermediate stage of fabrication, prior to deposition of copper to form the word line. A trench 411 extends where the bit line is to be formed (subsequent filling of trench with metal and removal of excess metal leaves bit line in a "damascene" process). The structure is shown during a chemical wet etch to remove amorphous silicon (a-Si) that forms a hard mask layer used to define the trench. Other cleans may also be performed to remove other materials (e.g. etch residue). A "wet" clean means that the structure is immersed in a liquid. Cleaning may be selective to amorphous silicon (i.e. may have a significantly higher rate of removal of amorphous silicon than silicon oxide).

As can be seen in FIG. 4, some chemical solution ("chemical") penetrates between tungsten via 303 and first silicon oxide layer 305 as shown by arrows. In some cases, silicon oxide, e.g. silicon oxide formed from TEOS, may not adhere well to tungsten so that penetration of chemical solution along such an interface is significant. Such penetration may damage the via structure and may lead to significant current leakage in a finished product. In some cases, this may cause an integrated circuit, such as a flash memory, to perform in an unsatisfactory manner or to fail. Thus, such penetration of chemicals is generally undesirable.

FIGS. 5A-D show an example of steps that may be used to form a contact between a via (contact plug) and a metal line with little or no penetration of chemical solution during wet clean. In particular, a nitridation step is illustrated, which may prevent or substantially reduce chemical penetration.

Figure 5A:
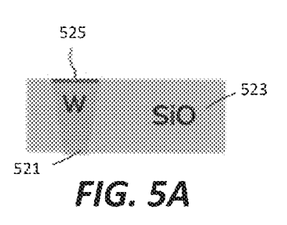
FIGS. 5A-D show an example of a process of forming bit line trenches on vias.

FIG. 5A shows a tungsten via 521 that extends through a first silicon oxide layer 523. A layer of tungsten oxide 525 (WO) extends along the top surface of tungsten via 521 where the tungsten is exposed to air. The tungsten oxide layer 525 may be a native oxide that occurs naturally from interaction between exposed tungsten and oxygen in air.

Figure 5B:
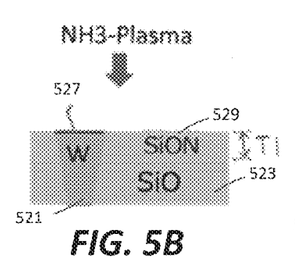

FIG. 5B illustrates a nitridation step in which a Radio Frequency (RF) plasma using ammonia (NH3) is used to remove the tungsten oxide layer 525 and to form a tungsten nitride layer 527. The tungsten nitride layer 527 may be thin (e.g. a thickness of from one to five nanometers (1 nm-5 nm). The nitridation step also interacts with first silicon oxide layer 523 to form silicon oxynitride (SiON) layer 529. Some silicon oxide of first silicon oxide layer 523 may be consumed to form silicon oxynitride layer 529 and the resulting silicon oxynitride may have approximately the same thickness (T1 in FIG. 5B) as the consumed silicon oxide so that the top surface of the silicon oxynitride layer 529 is approximately level with the top of the tungsten via 521.

Nitridation may be performed using various processes. In some cases, silicon oxide is formed in a plasma deposition chamber that can also be used for plasma nitridation so that nitridation may be performed immediately prior to deposition of an overlying silicon oxide layer. Such in-situ formation may be relatively quick (no additional loading/unloading, transferring etc.) and may not add significant cost. A gas other than $NH_3$ may be used as a nitrogen source. For example, nitrogen gas ($N_2$) may be used, although it has a higher activation energy, 24.3 eV compared with 2.2-6.6 eV for $NH_3$ and may therefore require a longer etch time. Other gases may be chosen as appropriate.

Figure 5C:
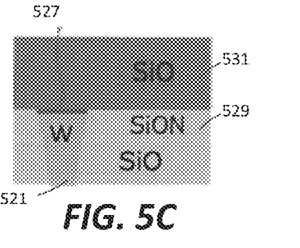

FIG. 5C shows the structure of FIG. 5B after deposition of a second silicon oxide layer 531 over silicon oxynitride layer 529 and the tungsten via 521. Second silicon oxide layer 531 lies in contact with silicon oxynitride layer 529 and tungsten nitride layer 527. It will be understood that the different materials in this example may have different properties to the materials of FIG. 4. For example, interfaces between materials, such as between tungsten and tungsten nitride or between tungsten and silicon oxynitride, may have improved adhesion.

Figure 5D:
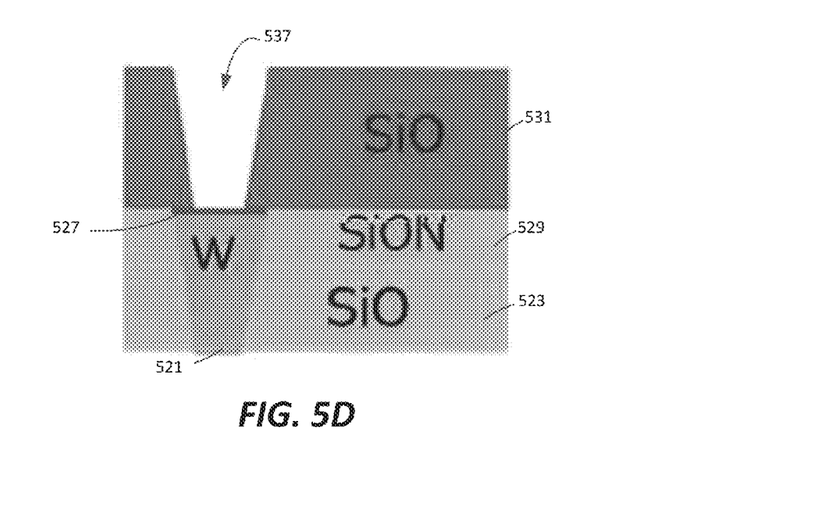

FIG. 5D shows the structure of FIG. 5C after formation of a trench 537 where a metal line (e.g. bit line) is to be located. When a wet etch is carried out on the structure of FIG. 5D, it can be seen that no interface between silicon oxide and tungsten is exposed to the wet etch solution. The interface between first silicon oxide layer 523 and tungsten via 521 is separated from the wet etch by the silicon oxynitride layer 529. Second silicon oxide layer 531 lies in contact with tungsten nitride layer 527. Silicon oxide generally has good adhesion to tungsten nitride, and tungsten nitride generally has good adhesion to tungsten, so that there is little or no penetration between second silicon oxide layer 531 and via 521. Thus, the presence of tungsten nitride on the top surface of the tungsten via 521 allows a good bond to be formed between tungsten nitride and silicon oxide, which may seal the bottom of trench 537 and prevent penetration of etch chemicals. Tungsten nitride layer 527 may act as an etch stop layer (i.e. etching may be selective to silicon oxide over silicon nitride).

While FIG. 5D shows a structure in which the trench 537 is perfectly aligned with the tungsten via 521 (i.e. trench extends to central area of top surface of the tungsten via), in many cases such alignment does not occur and there is some degree of misalignment. It is generally desirable that contact properties are acceptable for some range of alignment (i.e. for aligned and misaligned cases).

Figure 6:
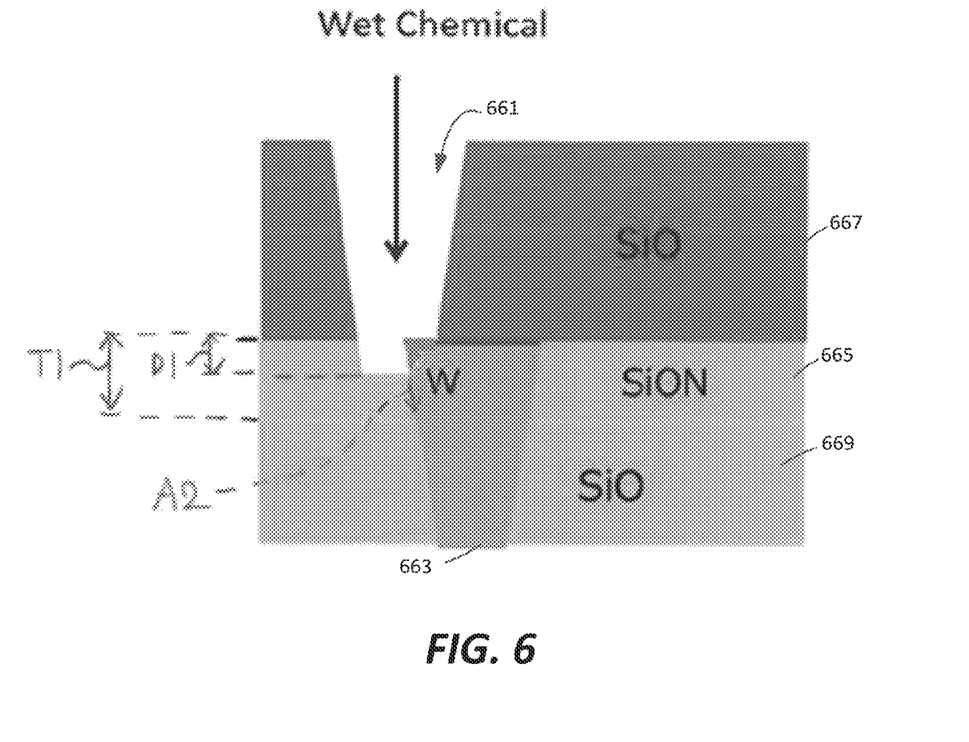
FIG. 6 shows an example of misalignment and trench depth.

FIG. 6 shows an example of a trench 661 that is misaligned with a via 663. In this case, the formation of trench 661 exposes not only tungsten nitride, it also exposes silicon oxynitride layer 665. Silicon oxynitride generally adheres better to tungsten than silicon oxide does so that the exposed interface between tungsten and silicon oxynitride (area A2) allows little or no penetration of chemical solution. Silicon oxynitride has a lower etch rate when exposed to certain etching or cleaning chemicals, including hydrofluoric acid. Thus, erosion of material and penetration of chemicals is generally reduced for silicon oxynitride compared with silicon oxide.

In general, in order to ensure a good contact, trench 661 may be etched to a depth that is somewhat deeper than the top surface of the via 663. This ensures that there is no material remaining at the bottom of the trench, which could prevent formation of a good contact. It also ensures that there is sufficient surface area for a good contact when there is misalignment as shown. The depth of the trench 661 in this example is such that the trench extends through second silicon oxide layer 667 and further extends partially through the silicon oxynitride layer 665. Silicon oxynitride layer 665 has thickness T1 in the example shown and the trench extends a depth D1 into the silicon oxynitride layer. This leaves a significant thickness of silicon oxynitride (T1-D1) between the bottom of trench 661 and first silicon oxide layer 669. This prevents first silicon oxide layer 669 from being exposed during the wet etch. Specifically, the interface between the tungsten via 663 and the first silicon oxide layer 669 is not exposed because at least some of silicon oxynitride layer 665 remains in place under trench 661 and along the side of the tungsten via 663 as shown.

A nitridation process and subsequent trench etching may be tuned to achieve suitable dimensions. For example, the thickness of the silicon oxynitride layer may be in the range of ten nanometers to thirty nanometers (10 nm to 30 nm). The depth D1 may be approximately half the total thickness of the silicon oxynitride layer, e.g. if the oxynitride layer is twenty nanometers (20 nm) thick, then the depth that the trench extends into the silicon oxynitride layer (D1) may be approximately ten nanometers (10 nm).

Subsequent to the stage showed in FIG. 6, metal such as copper is deposited to fill the trench (with barrier layer or layers as appropriate), and then excess metal is removed, e.g. by Chemical Mechanical Polishing (CMP). It can be seen that the depth D1 provides an additional area for contact between copper and tungsten (vertical surface with height D1). Thus, the choice of dimension D1 may depend on acceptable contact resistance and alignment tolerance. Dimension T1 may be chosen accordingly.

It can be seen that the effects of the nitridation step include formation of a thin layer of tungsten nitride on the tungsten via, which has improved adhesion with subsequently formed silicon oxide, and formation of a layer of silicon oxynitride on the first silicon oxide layer, which has improved adhesion compared with silicon oxide. Thus, nitridation has at least two beneficial effects.

Figure 7:
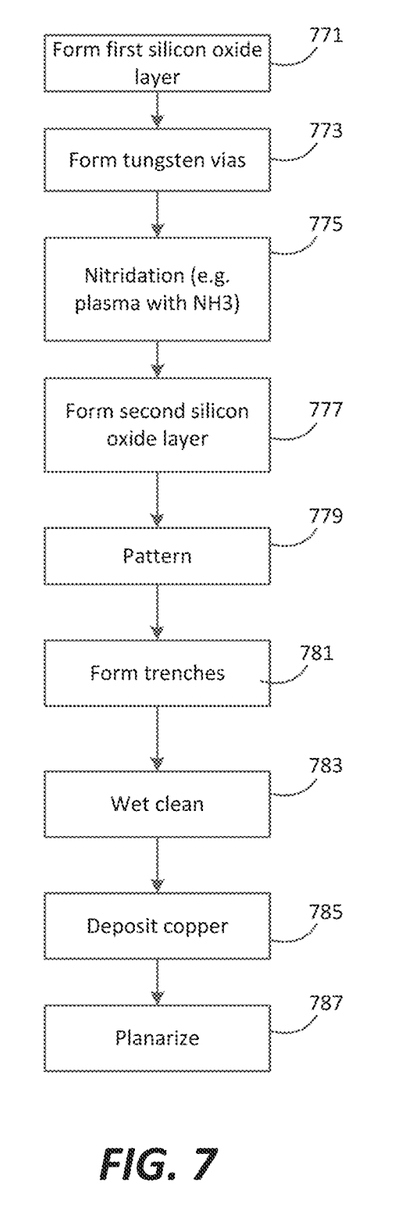
FIG. 7 shows an example of process steps used to form vias and bit line trenches.

An example of process steps used to form a metal line in contact with a tungsten via is shown in FIG. 7. A first silicon oxide layer is formed 771 over a substrate, for example using TEOS in a CVD process. The substrate may contain active areas such as NAND strings with contact areas to be contacted by vias. Then a tungsten via is formed 773 in the first silicon oxide layer at a location that provides electrical contact with a contact area. A nitridation step is then performed 775 using a plasma CVD process with ammonia (NH3) to form tungsten nitride on exposed areas of tungsten via and to form silicon oxynitride on exposed areas of silicon oxide. Subsequently, a second silicon oxide layer is formed 777. Patterning is then performed 779 so that a hard mask layer, e.g. amorphous silicon, extends over the second silicon oxide layer and has elongated openings where trenches are to be formed in the second silicon oxide layer. Anisotropic etching, e.g. Reactive Ion Etching (RIE), is then performed with the hard mask in place so that trenches are formed 781 according to the pattern established. A wet clean is then used 783 to remove the hard mask layer (e.g. using HF to selectively remove amorphous silicon). Copper is then deposited 785 to fill trenches, and excess copper is removed by planarization 787 (e.g. using CMP).

CONCLUSION

Although the various aspects have been described with respect to examples, it will be understood that protection within the full scope of the appended claims is appropriate.

It is claimed:

1. A method of forming an integrated circuit comprising:
   forming a tungsten via in a first silicon oxide layer;
   performing a nitridation step that forms a tungsten nitride layer on an exposed top surface of the tungsten via and forms a silicon oxynitride layer on the first silicon oxide layer;
   subsequently, forming a second silicon oxide layer over the first silicon oxide layer and the tungsten via;
   subsequently, forming an opening through the second silicon oxide layer to expose at least part of the tungsten nitride layer; and
   subsequently, performing a wet clean step.

2. The method of claim 1 further comprising subsequently depositing a metal in the opening to electrically contact the tungsten via.

3. The method of claim 1 wherein the opening through the second silicon oxide layer extends into the silicon oxynitride layer a depth that is less than the thickness of the silicon oxynitride layer.

4. The method of claim 3 wherein the first silicon oxide layer is isolated from the wet clean by a remaining thickness of the silicon oxynitride layer under the opening.

5. The method of claim 3 wherein no direct interface between the first silicon oxide layer and the tungsten via is exposed during the wet clean step.

6. The method of claim 1 wherein performing the nitridation step includes supplying ammonia (NH3) to a process chamber.

7. The method of claim 6 wherein performing the nitridation step includes generating a Radio Frequency (RF) plasma in the process chamber.

8. The method of claim 1 wherein performing the nitridation step includes supplying nitrogen (N2) to a process chamber.

9. The method of claim 1 wherein the integrated circuit is a NAND flash memory.

* * * * *